US010273581B2

(12) United States Patent
Kobayashi et al.

(10) Patent No.: US 10,273,581 B2
(45) Date of Patent: Apr. 30, 2019

(54) CARBON-COATING-FILM CLEANING METHOD AND DEVICE

(71) Applicant: HONDA MOTOR CO., LTD., Tokyo (JP)

(72) Inventors: Koji Kobayashi, Tochigi (JP); Junya Funatsu, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/778,302

(22) PCT Filed: May 30, 2014

(86) PCT No.: PCT/JP2014/064467
§ 371 (c)(1),
(2) Date: Sep. 18, 2015

(87) PCT Pub. No.: WO2014/192929
PCT Pub. Date: Dec. 4, 2014

(65) Prior Publication Data
US 2016/0281217 A1    Sep. 29, 2016

(30) Foreign Application Priority Data

May 31, 2013  (JP) .................................. 2013-116035

(51) Int. Cl.
*C23C 16/02*    (2006.01)
*C23C 16/26*    (2006.01)
(Continued)

(52) U.S. Cl.
CPC .............. *C23C 16/50* (2013.01); *C23C 16/02* (2013.01); *C23C 16/0227* (2013.01);
(Continued)

(58) Field of Classification Search
USPC ......................................................... 118/733
See application file for complete search history.

(56) References Cited

U.S. PATENT DOCUMENTS

| 2006/0011468 A1* | 1/2006 | Boardman | ............ C23C 16/045 |
| | | | 204/192.12 |
| 2006/0196419 A1* | 9/2006 | Tudhope | ............. C23C 16/0272 |
| | | | 118/715 |

(Continued)

FOREIGN PATENT DOCUMENTS

| JP | 09-031626 | 2/1997 |
| JP | 09-195036 | 7/1997 |

(Continued)

OTHER PUBLICATIONS

Japanese Office Action dated Dec. 22, 2015, 6 pages.

(Continued)

*Primary Examiner* — Parviz Hassanzadeh
*Assistant Examiner* — Tiffany Z Nuckols
(74) *Attorney, Agent, or Firm* — Rankin, Hill & Clark LLP

(57) ABSTRACT

The present invention provides a method for cleaning a carbon coating film, which can clean the carbon coating film that is formed on each portion of a plasma CVD device, and provides the plasma CVD device. The plasma CVD device 1 includes: first and second sealing members 2a and 2b which are formed of insulators and seal both ends of a workpiece W or a dummy workpiece W', respectively; an anode 3; decompression units 26 which decompress the inside of the workpiece W or the dummy workpiece W'; a source-gas supply unit 6 which supplies a source gas to the inside of the workpiece W; a power source 27; and an oxygen-gas supply unit 8 which supplies oxygen gas to the inside of the dummy workpiece W'.

4 Claims, 4 Drawing Sheets

(51) Int. Cl.
  *C23C 16/455* (2006.01)
  *C23C 16/50* (2006.01)
  *C23C 16/515* (2006.01)
  *C23C 16/04* (2006.01)
  *H01J 37/32* (2006.01)

(52) U.S. Cl.
  CPC ............ *C23C 16/045* (2013.01); *C23C 16/26* (2013.01); *C23C 16/455* (2013.01); *C23C 16/515* (2013.01); *H01J 37/32009* (2013.01)

(56) References Cited

U.S. PATENT DOCUMENTS

| | | | |
|---|---|---|---|
| 2008/0029494 A1* | 2/2008 | Tudhope | C23C 8/36 219/121.47 |
| 2009/0311443 A1 | 12/2009 | Boardman et al. | |
| 2011/0151141 A1* | 6/2011 | Upadhyaya | C23C 16/045 427/578 |
| 2012/0231177 A1* | 9/2012 | Wei | C23C 16/0227 427/523 |
| 2014/0137976 A1* | 5/2014 | Miller | E21B 17/00 138/145 |

FOREIGN PATENT DOCUMENTS

| | | |
|---|---|---|
| JP | 10-110269 | 4/1998 |
| JP | 2000-297373 | 10/2000 |
| JP | 3555844 | 5/2004 |
| JP | 2005-089735 | 4/2005 |
| JP | 2007-119870 | 5/2007 |
| JP | 2008-506840 | 3/2008 |
| JP | 2010-531931 | 9/2010 |
| JP | 2011-162857 | 8/2011 |
| JP | 4973971 | 4/2012 |
| JP | 5043657 | 7/2012 |
| JP | 2013-065417 | 4/2013 |
| WO | 00/79021 A1 | 12/2000 |
| WO | 2006/019565 | 2/2006 |
| WO | 2009/006178 | 1/2009 |

OTHER PUBLICATIONS

International Search Report, dated Sep. 9, 2014 (dated Sep. 9, 2014).

Indian Office Action (Examination Report) dated Apr. 20, 2018, 5 pages.

* cited by examiner

CARBON-COATING-FILM CLEANING METHOD AND DEVICE

TECHNICAL FIELD

The present invention relates to a carbon-coating-film cleaning method and device.

BACKGROUND ART

Conventionally, a sliding member such as a cylinder block and a piston which is used in a lubricant oil needs to reduce a mechanical loss, in order to lower energy consumption and the like. For this reason, it is investigated to decrease the friction of the above described sliding member.

For instance, a carbon-coated sliding member is known which has a carbon coating film such as a diamond-like carbon coating film (hereinafter occasionally abbreviated as DLC coating film) provided on the surface of the above described sliding member (for instance, see Patent Literatures 1 and 2), in order to decrease the friction of the sliding member.

The above described carbon-coated sliding member can be produced, for instance, by a plasma CVD device. The above described plasma CVD device supplies a source gas to the inside of a workpiece such as an electroconductive sliding member, of which the inside is kept at a predetermined degree of vacuum, and simultaneously applies a negative bias voltage to the workpiece which is set as a cathode. As a result of the above operation, a potential difference occurs between an anode provided in the above described plasma CVD device, and the workpiece which is set as the above described cathode, and an electric discharge occurs. The above described electric discharge enables a plasma of the above described source gas to be generated in the inside of the above described workpiece.

Here, a hydrocarbon gas such as acetylene is used as the above described source gas, and thereby a plasma mainly of carbon can be generated in the inside of the above described workpiece. As a result, the above described plasma of carbon enables carbon and the like to be deposited on an inner surface of the above described workpiece, and enables a carbon coating film, for instance, such as the above described DLC coating film, to be formed thereon (for instance, see Patent Literature 3).

CITATION LIST

Patent Literature

Patent Literature 1: Japanese Patent No. 3555844
Patent Literature 2: Japanese Patent No. 4973971
uPatent Literature 3: Japanese Patent No. 5043657

SUMMARY OF INVENTION

Technical Problem

However, in the above described plasma CVD device, the carbon and the like are deposited not only on the inner surface of the above described workpiece but also on each portion in the device to form the carbon coating film, which becomes an obstacle for the operation of the device and a cause of contamination. Accordingly, it is desirable to periodically clean the carbon coating film.

The present invention is designed with respect to such circumstances, and an object of the present invention is to provide a carbon-coating-film cleaning method which can clean the above described carbon coating film that is formed on each portion in the above described plasma CVD device, and to provide a plasma CVD device which is used in the method.

Solution to Problem

In order to achieve such an object, a carbon-coating-film cleaning method of the present invention is a method for cleaning a carbon coating film in a plasma CVD device which includes: first and second sealing members that have bottomed cylindrical shapes, are formed of insulators and seal both ends of a cylindrical electroconductive workpiece, respectively; a decompression unit which decompresses an inside of the workpiece through the first sealing member; a power source which applies a bias voltage to the workpiece; a source-gas supply unit which supplies a source gas containing a hydrocarbon to the inside of the workpiece through the second sealing member; and an anode which is mounted at least in the second sealing member out of the first and second sealing members, the method including providing an oxygen-gas supply unit which supplies oxygen gas, when the workpiece has been replaced with a cylindrical electroconductive dummy workpiece, to the inside of the dummy workpiece; a step of forming the carbon coating film on an inner surface of the workpiece by sealing both ends of the workpiece with the first and second sealing members, respectively, applying a bias voltage from the power source to the workpiece which is set as a cathode with respect to the anode, while supplying a source gas by the source-gas supply unit to the inside of the workpiece that has been decompressed to a predetermined degree of vacuum by the decompression unit, and thereby generating a plasma of the source gas in the inside of the workpiece; a step of replacing the workpiece having the carbon coating film formed on the inner surface with the cylindrical electroconductive dummy workpiece, and generating an oxygen plasma in the inside of the dummy workpiece, by decompressing the inside of the dummy workpiece to a predetermined degree of vacuum by the decompression unit, and applying a bias voltage from the power source to the dummy workpiece which is set as a cathode with respect to the anode, while supplying oxygen gas to the inside of the dummy workpiece by the oxygen-gas supply unit; and a step of decomposing and removing the carbon coating film which is formed on each portion of the plasma CVD device, by the oxygen plasma.

The carbon-coating-film cleaning method of the present invention includes firstly sealing both ends of the cylindrical electroconductive workpiece by first and second sealing members which have the bottomed cylindrical shapes, are formed of the insulators, respectively, and thereby mounting the workpiece in the plasma CVD device. Next, the method includes supplying a source gas to the inside of the workpiece by the above described source-gas supply unit, while decompressing the inside of the above described workpiece to a predetermined degree of vacuum by the above described decompression unit. The method includes, then applying a bias voltage to the workpiece which is set as the cathode by the above described power source, in a state in which the inside of the above described workpiece is kept at the predetermined degree of vacuum.

As a result of the above operation, the bias voltage is applied to the above described workpiece, and a potential difference occurs between the above described anode which is insulated from the above described workpiece by the above described first and second sealing members, and the workpiece which is set as the above described cathode, and an electric discharge occurs. Then, a plasma of the above described source gas is generated in the inside of the above described workpiece due to the above described electric discharge. At this time, the above described workpiece functions as the cathode, and accordingly carbon and the like are deposited on the inner surface of the workpiece, and the carbon coating film can be formed thereon.

The above described anode needs to be provided at least in the second sealing member to which the source gas is supplied. In addition, the above described anode is preferably provided also in the first sealing member. Then, the anode disperses loaded voltage, can generate a stable plasma, and besides, can reduce the consumption of the electrode.

Incidentally, in the above described plasma CVD device, when the above described carbon coating film is formed on the inner surface of the above described workpiece in the above described way, the above described carbon coating film is formed also on each portion in the device, for instance, on the inner surface of the above described first and second sealing members and the like. When the above described carbon coating film formed on the inner surface of each of the above described portions in the device is accumulated, the accumulated carbon coating film becomes an obstacle for the operation of the device and a cause of contamination.

For this reason, in the carbon-coating-film cleaning method of the present invention, after the above described carbon coating film has been formed on the inner surface of the above described workpiece, the workpiece is replaced with the cylindrical electroconductive dummy workpiece. Subsequently, oxygen gas is supplied to the inside of the dummy workpiece by the above described oxygen-gas supply unit, while the inside of the above described dummy workpiece is decompressed to a predetermined degree of vacuum by the above described decompression unit. Then, in a state in which the inside of the above described dummy workpiece is kept at the predetermined degree of vacuum, the bias voltage is applied to the dummy workpiece which is set as the cathode, by the above described power source.

As a result of the above operation, the potential difference occurs between the above described anode and the dummy workpiece which is set as the above described cathode, and the electric discharge occurs, similarly to the case of the above described source gas. Then, the oxygen plasma is generated in the inside of the above described dummy workpiece due to the above described electric discharge. At this time, the density of the above described oxygen plasma becomes extremely high due to a hollow cathode effect. Accordingly, the above described carbon coating film formed in the inside of the above described plasma CVD device can be decomposed and removed by the above described oxygen plasma, and the carbon coating film can be cleaned.

Incidentally, when the above described carbon coating film formed in the inside of the above described plasma CVD device is cleaned in the above described way, the above described electric discharge occurs at the tip of the above described anode. Accordingly, there is the case where the above described oxygen plasma is not sufficiently generated in the periphery of the above described anode mounted in the above described second sealing member, and the above described carbon coating film cannot be sufficiently removed.

For this reason, in the carbon-coating-film cleaning method of the present invention, it is preferable to generate an oxygen plasma in a more upstream side of the oxygen gas which is supplied by the oxygen-gas supply unit, than the anode, and to decompose and remove a carbon coating film which has been formed in a periphery of the anode, by the oxygen plasma.

In order to generate the oxygen plasma in the more upstream side of the oxygen gas which is supplied by the above described oxygen-gas supply unit, than the above described anode, another anode, for instance, may be provided in the upstream side of the oxygen gas which is supplied by the oxygen-gas supply unit, with respect to the anode. Alternatively, a portion to which the bias voltage is applied may also be provided in the upstream side of the oxygen gas which is supplied by the above described oxygen-gas supply unit, with respect to the above described anode.

When the above method is adopted, a region in which the above described oxygen plasma is generated results in being expanded up to the upstream side of the oxygen gas that is supplied by the above described oxygen-gas supply unit, and the above described carbon coating film which has been formed in the periphery of the anode can be efficiently decomposed and removed by the oxygen plasma.

In the carbon-coating-film cleaning method of the present invention, a workpiece to be treated next is preferably used as the dummy workpiece. When the workpiece to be treated next is used as the above described dummy workpiece, the above described carbon coating film formed in the inside of the above described plasma CVD device is cleaned by the above described oxygen plasma, and at the same time, the cleaning which removes oxygen, hydrogen or water, and the like which are deposited on the workpiece, can be performed by the oxygen plasma as a pretreatment of the workpiece.

When the workpiece to be treated next is mounted in the plasma CVD device, and the workpiece is cleaned at the same time that the above described carbon coating film which has been formed in the inside of the above described plasma CVD device is cleaned, the preparation of the dummy workpiece can thereby become unnecessary. In addition, it becomes possible to omit an air opening step, an exhausting step and a preheating step which are needed when the dummy workpiece is replaced with the workpiece to be treated next, and the process can be shortened.

The plasma CVD device of the present invention includes: first and second sealing members which have bottomed cylindrical shapes, are formed of insulators and seal both ends of a cylindrical electroconductive workpiece, respectively; a decompression unit which decompresses an inside of the workpiece through the first sealing member; a power source which applies a bias voltage to the workpiece; a source-gas supply unit which supplies a source gas containing a hydrocarbon to the inside of the workpiece through the second sealing member; and a first anode which is mounted at least in the second sealing member out of the first and second sealing members; and an oxygen-gas supply unit which supplies oxygen gas to the inside of a cylindrical electroconductive dummy workpiece when the workpiece has been replaced with the dummy workpiece.

According to the plasma CVD device of the present invention, in the above described carbon-coating-film cleaning method, after the above described carbon coating film has been formed on the inner surface of the above described workpiece, and the workpiece having the carbon coating film formed on the inner surface has been replaced with the above described dummy workpiece, the above described oxygen gas, in place of the above described source gas which is supplied by the above described source-gas supply unit, can be supplied to the inside of the dummy workpiece by the oxygen-gas supply unit.

Then, in the plasma CVD device of the present invention, the bias voltage is applied to the above described dummy workpiece by the above described power source, and thereby the potential difference occurs between the above described first anode and the dummy workpiece, and the electric discharge occurs. By the above described electric discharge, the oxygen plasma can be generated in the inside of the dummy workpiece, and by the oxygen plasma, the above described carbon coating film which has been deposited on the plasma CVD device can be cleaned.

In addition, the plasma CVD device of the present invention is preferably configured to have a second anode provided in a more upstream side of the oxygen gas which is supplied from the oxygen-gas supply unit, than the first anode, and to apply a predetermined voltage to either one or both of the first anode and the second anode.

When having the above described second anode, the plasma CVD device of the present invention switches the above described first anode provided in the above described second sealing member to the second anode, when the above described oxygen gas is supplied to the inside of the above described dummy workpiece, and applies the above described predetermined voltage to the second anode. Subsequently, the bias voltage is applied to the above described dummy workpiece by the above described power source, and thereby a potential difference occurs between the above described second anode and the dummy workpiece, and the electric discharge occurs. By the above described electric discharge, the oxygen plasma can be generated in the inside of the dummy workpiece.

At this time, the above described second anode is provided in the more upstream side of the oxygen gas which is supplied from the above described oxygen-gas supply unit, than the above described first anode. Accordingly, a region in which the above described oxygen plasma is generated can be expanded up to a more upstream side of the oxygen gas which is supplied by the above described oxygen-gas supply unit, than the above described first anode, and the above described carbon coating film which has been formed in the periphery of the first anode can be efficiently decomposed and removed.

In addition, the above described second anode may not be replaced with the above described first anode, but the above described predetermined voltage may be applied to both of the first anode and the second anode.

In addition, the plasma CVD device of the present invention has preferably a second cathode to which the bias voltage is applied by the power source, provided in the upstream side of the oxygen gas which is supplied from the oxygen-gas supply unit.

When having the above described second cathode, the plasma CVD device of the present invention applies the bias voltage to the above described dummy workpiece and the second cathode by the above described power source, when the above described oxygen gas has been supplied to the inside of the above described dummy workpiece. By the above operation, a potential difference occurs between the above described first anode and each of the above described dummy workpiece and the above described second cathode, and the electric discharge occurs. By the above described electric discharge, the above described oxygen plasma can be generated in the inside of the above described dummy workpiece, and at the same time, the oxygen plasma can be generated also between the above described first anode and the above described second cathode.

At this time, the above described second cathode is provided in the upstream side of the oxygen gas which is supplied from the above described oxygen-gas supply unit. Accordingly, a region in which the above described oxygen plasma is generated can be expanded up to an upstream side of the oxygen gas which is supplied from the above described oxygen-gas supply unit, and the above described carbon coating film which has been formed in the periphery of the first anode can be efficiently decomposed and removed.

In the plasma CVD device of the present invention, only any one of the above described second anode and the above described second cathode may be provided, and both of the second anode and the second cathode may also be provided.

DESCRIPTION OF EMBODIMENTS

Next, embodiments of the present invention will be described in more detail with reference to the attached drawings.

Figure 1:
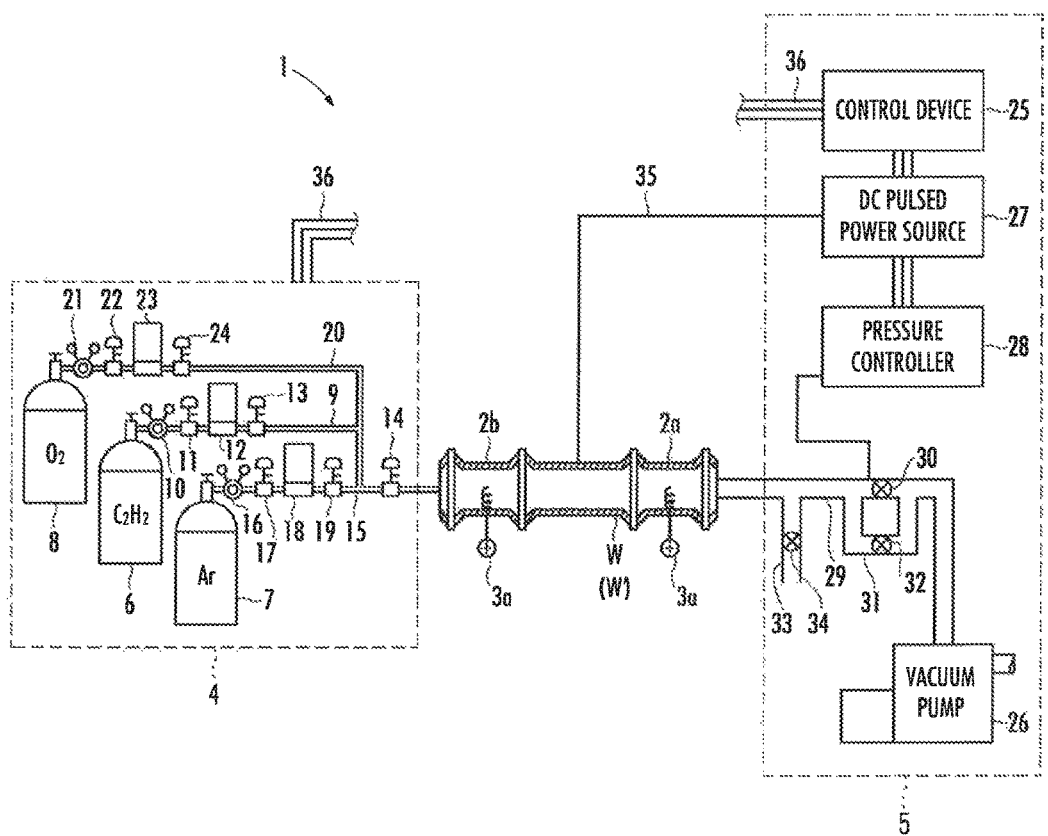
FIG. 1 is a system block diagram showing a configuration of a first aspect of a plasma CVD device of the present invention.

As is shown in FIG. 1, a plasma CVD device 1 of the first aspect of the present embodiment includes: a first sealing member 2a and a second sealing member 2b which seal both ends of a workpiece W; first anodes 3a and 3a which are mounted in the sealing members 2a and 2b, respectively; a gas supply subsystem 4; and a process control subsystem 5.

The workpiece W is formed of a hollow cylindrical conductor, and is, for instance, a cylinder block of an internal combustion engine, and the like. The workpiece W is configured so as to work as the first cathode.

The first sealing member 2a and the second sealing member 2b are each a hollow bottomed cylindrical body which is formed of an insulator, and are each communicated with the inside of the workpiece W, at the end of its aperture. The first anodes 3a and 3a are rod-like electrodes, and are inserted into the inside of the first sealing member 2a and the second sealing member 2b from through holes (not-shown) which are provided in the first sealing member 2a and the second sealing member 2b, respectively. In addition, the first anodes 3a and 3a are configured so as to be connected to a not-shown circuit and to be positively charged.

The workpiece W which works as the first cathode and the first anodes 3a and 3a are insulated from each other, by the first sealing member 2a and the second sealing member 2b which are each formed of the insulator.

The gas supply subsystem 4 includes: an acetylene-gas supply container 6 which functions as a source-gas supply unit; an argon-gas supply container 7; and an oxygen-gas supply container 8 which functions as an oxygen-gas supply unit. The acetylene-gas supply container 6 is connected to a hollow portion of the workpiece W by a duct 9, through a pressure gauge 10, a primary side valve 11 of a flow rate control device, a flow rate control device 12, a secondary side valve 13 of the flow rate control device, an on-off valve 14 and the second sealing member 2b. A duct 15 is connected to the argon-gas supply container 7, and the duct 15 is connected to the duct 9 in an upstream side of the on-off valve 14, through a pressure gauge 16, a primary side valve 17 of a flow rate control device, a flow rate control device 18 and a secondary side valve 19 of the flow rate control device.

In addition, a duct 20 is connected to the oxygen-gas supply container 8, and the duct 20 is connected to the duct 9 in the upstream side of the on-off valve 14 through a pressure gauge 21, a primary side valve 22 of a flow rate control device, the flow rate control device 23, and a secondary side valve 24 of the flow rate control device.

The process control subsystem 5 includes: a control device 25 which is formed of a personal computer and the like; a vacuum pump 26 which is controlled by the control device 25 and functions as the decompression unit; a DC pulsed power source 27 which works as the power source; and a pressure controller 28. The vacuum pump 26 is connected to the inside of the workpiece W by a duct 29, through an on-off valve 30 and the first sealing member 2a.

The duct 29 has a slow pipe 31 which connects the primary side and the secondary side of the on-off valve 30, and a slow valve 32 is arranged in the slow pipe 31. In addition, the duct 29 has a vent pipe 33 in between the slow pipe 31 and the sealing member 2a, and a vent valve 34 is arranged in the vent pipe 33.

The DC pulsed power source 27 has a DC cable 35, and the DC cable 35 is connected to an outer surface of the workpiece W. In addition, the pressure controller 28 is electrically connected to the on-off valve 30 which is provided in the duct 29, the slow valve 32 which is provided in the slow pipe 31, and the vent valve 34 which is provided in the vent pipe 33. The pressure controller 28 controls opening and closing of the on-off valve 30, the slow valve 32 and the vent valve 34.

In addition, the control device 25 is electrically connected to the gas supply subsystem 4 through an interface cable 36. As a result of this, the control device 25 results in being configured so as to control: the primary side valve 11 of the flow rate control device, the flow rate control device 12, the secondary side valve 13 of the flow rate control device, and the on-off valve 14, which are provided in the duct 9; the primary side valve 17 of the flow rate control device, the flow rate control device 18, and the secondary side valve 19 of the flow rate control device, which are provided in the duct 15; and the primary side valve 22 of the flow rate control device, the flow rate control device 23, and the secondary side valve 24 of the flow rate control device, which are provided in the duct 20.

Next, the method for cleaning the carbon coating film by the plasma CVD device 1 of the present embodiment will be described.

In the carbon-coating-film cleaning method of the present embodiment, firstly, the DLC coating film is formed on the inner surface of the workpiece W by the plasma CVD device 1. When the DLC coating film is formed on the inner surface of the workpiece W by the plasma CVD device 1, in STEP 1 shown in FIG. 2, both ends of the workpiece W are sealed by the first sealing member 2a and the second sealing member 2b, respectively. Thereby, the workpiece W is mounted in the plasma CVD device 1.

Subsequently, in STEP 2, the inside of each of the workpiece W, the first sealing member 2a and the second sealing member 2b is decompressed to a predetermined degree of vacuum. As for the above described decompression, firstly, the slow valve 32 is opened by the control device 25 through the pressure controller 28, in a state in which the on-off valve 30 is closed, and the vacuum pump 26 is operated. Then, pressures in the primary side and the secondary side of the on-off valve 30 are reduced to a predetermined degree of vacuum at which the on-off valve 30 becomes operable.

Subsequently, if the pressures in the primary side and the secondary side of the on-off valve 30 have been reduced to the above described predetermined degree of vacuum, the slow valve 32 is closed by the control device 25 through the pressure controller 28, and the on-off valve 30 is opened to a predetermined degree of opening. As a result of this, the inside of each of the workpiece W, the first sealing member 2a and the second sealing member 2b is decompressed, for instance, to a degree of vacuum of 1 to 100 Pa.

At this time, any of valves is closed that are: the primary side valve 11 of the flow rate control device, the secondary side valve 13 of the flow rate control device, and the on-off valve 14, which are provided in the duct 9; the primary side valve 17 of the flow rate control device, and the secondary side valve 19 of the flow rate control device, which are provided in the duct 15; and the primary side valve 22 of the flow rate control device, and the secondary side valve 24 of the flow rate control device, which are provided in the duct 20.

If the inside of each of the workpiece W, the first sealing member 2a and the second sealing member 2b has been decompressed as in the above description, subsequently, in STEP 3, the inner surface of the workpiece W is cleaned. When the inner surface of the workpiece W is cleaned, firstly, the on-off valve 14 which is provided in the duct 9 of the gas supply subsystem 4, the primary side valve 17 of the flow rate control device and the secondary side valve 19 of the flow rate control device, which are provided in the duct 15, are opened by the control device 25, and argon gas is supplied to the inside of the workpiece W from the argon-gas supply container 7.

Subsequently, a negative pulsed current is supplied to the workpiece W from the DC pulsed power source 27 through the DC cable 35 by the control device 25. As a result of the above operation, the bias voltage results in being applied to the workpiece W, the potential difference occurs between the first anode 3a, and the workpiece W which is set as the first cathode, and the electric discharge occurs. Then, an argon plasma is generated in the inside of the workpiece W, due to the above described electric discharge. At this time, the workpiece W functions as the first cathode, accordingly the above described argon plasma results in attacking the inner surface of the workpiece W, the inner surface of the workpiece W is cleaned by the argon plasma, and the cleaning can be performed.

If the inner surface of the workpiece W has been cleaned, subsequently, in STEP 4, acetylene gas is supplied to the inside of the workpiece W. The primary side valve 11 of the flow rate control device, and the secondary side valve 13 of the flow rate control device, which are provided in the duct 9 of the gas supply subsystem 4, are opened by the control device 25, and thereby the above described acetylene gas is supplied. As a result of this, acetylene gas is supplied to the inside of the workpiece W from the acetylene-gas supply container 6, together with the above described argon gas.

At this time, the flow rate of the above described acetylene gas is set to be in a range, for instance, of 500 to 4,000 sccm, by the flow rate control device 12, and the flow rate of the above described argon gas is set to be in a range, for instance, of 100 to 1,000 sccm, by the flow rate control device 18. Then, the on-off valve 30 is opened to a predetermined degree of opening by the control device 25 through the pressure controller 28, and the inside of each of the workpiece W, the first sealing member 2a and the second sealing member 2b is kept at a degree of vacuum, for instance, of 5 to 30 Pa.

Next, in STEP 5, a carbon plasma is generated in the inside of each of the workpiece W, the first sealing member 2a and the second sealing member 2b. In order to generate the above described carbon plasma, a negative pulsed current, for instance, of 2 to 100 A is supplied to the workpiece W from the DC pulsed power source 27 through the DC cable 35, for instance, for 5 to 200 seconds, by the control device 25. As a result of the above operation, the bias voltage results in being applied to the workpiece W, the potential difference occurs between the workpiece W and each of the first anodes 3a and 3a, because the workpiece W functions as the first cathode as in the above description, and the electric discharge occurs. Then, acetylene gas is converted into a plasma state due to the above described electric discharge, and a plasma mainly of carbon is generated.

As a result of the above operation, in STEP 6, the above described carbon plasma is attracted to the inner surface of the workpiece W which is set as the first cathode, and the carbon is deposited onto the surface, and the above described DLC coating film is formed. In addition, a duty cycle of the above described pulsed current is adjusted by the control device 25, and thereby when the duty cycle is turned off, the above described acetylene gas and argon gas result in being supplemented. As a result of this, the above described DLC coating film having a uniform thickness can be formed on the inner surface of the workpiece W. Then, the control device 25 closes the primary side valve 11 of the flow rate control device, the secondary side valve 13 of the flow rate control device, and the on-off valve 14, which are provided in the duct 9, and the primary side valve 17 of the flow rate control device, and the secondary side valve 19 of the flow rate control device, which are provided in the duct 15; stops the vacuum pump 26 and the DC pulsed power source 27; and ends the formation of the above described DLC coating film.

At this time, the above described DLC coating film is formed not only on the inner surface of the workpiece W, but also, for instance, on the inner surface of the first sealing member 2a and the second sealing member 2b. When the above described DLC coating film is accumulated, the accumulated DLC coating film becomes an obstacle for the operation of the device and a cause of contamination.

For this reason, in the carbon-coating-film cleaning method of the present embodiment, after the above described DLC coating film has been formed on the inner surfaces of the predetermined number of the workpieces W, in STEP 7, the workpiece W is replaced with a cylindrical electroconductive dummy workpiece W', and thereby the carbon coating film is cleaned. The dummy workpiece W' may be another member having the same shape as that of the workpiece W, and a workpiece W to be treated next may be used as the dummy workpiece W'.

Both ends of the dummy workpiece W' which has been replaced with the workpiece W are sealed by the first sealing member 2a and the second sealing member 2b, respectively. Thereby, the dummy workpiece W' is mounted in the plasma CVD device 1.

When the carbon coating film is cleaned by the plasma CVD device 1, firstly, in STEP 8, the inside of each of the dummy workpiece W', the first sealing member 2a and the second sealing member 2b is decompressed to a predetermined degree of vacuum. The above described decompression can be performed in the completely same method as that in the case where the DLC coating film is formed on the inner surface of the workpiece W. As a result of this, the inside of each of the dummy workpiece W', the first sealing member 2a and the second sealing member 2b is decompressed to a degree of vacuum, for instance, of 1 to 100 Pa.

At this time, any of valves is closed that are: the primary side valve 11 of the flow rate control device, the secondary side valve 13 of the flow rate control device, and the on-off valve 14, which are provided in the duct 9; the primary side valve 17 of the flow rate control device, and the secondary side valve 19 of the flow rate control device, which are provided in the duct 15; and the primary side valve 22 of the flow rate control device, and the secondary side valve 24 of the flow rate control device, which are provided in the duct 20.

If the inside of each of the workpiece W, the first sealing member 2a and the second sealing member 2b has been decompressed as in the above description, subsequently, in STEP 9, oxygen gas is supplied to the inside of the dummy workpiece W'.

When the above described oxygen gas is supplied, firstly, the valves are opened by the control device 25, which are the on-off valve 14 that is provided in the duct 9 of the gas supply subsystem 4, and the primary side valve 17 of the flow rate control device, and the secondary side valve 19 of the flow rate control device, which are provided in the duct 15. Then, argon gas is supplied to the inside of the dummy workpiece W' from the argon-gas supply container 7.

In addition, simultaneously with the above operation, the primary side valve 22 of the flow rate control device, and the secondary side valve 24 of the flow rate control device are opened by the control device 25, which are provided in the duct 20 of the gas supply subsystem 4. As a result of this, oxygen gas is supplied to the inside of the dummy workpiece W' from the oxygen-gas supply container 8, together with the above described argon gas.

At this time, the flow rate of the above described argon gas is set to be in a range, for instance, of 100 to 2,000 sccm, by the flow rate control device 18, and the flow rate of the above described oxygen gas is set to be in a range, for instance, of 500 to 4,000 sccm, by the flow rate control device 23. In addition, the on-off valve 30 is opened to a predetermined degree of opening by the control device 25 through the pressure controller 28, and the inside of the dummy workpiece W' is kept at a degree of vacuum, for instance, of 5 to 30 Pa.

Subsequently, in STEP 10, an oxygen plasma is generated in the inside of each of the dummy workpiece W', the first sealing member 2a and the second sealing member 2b. In order to generate the above described plasma of the oxygen, the negative pulsed current, for instance, of 2 to 100 A is supplied to the dummy workpiece W' from the DC pulsed power source 27 through the DC cable 35, for instance, for 30 to 200 seconds, by the control device 25. As a result of the above operation, the bias voltage results in being applied to the dummy workpiece W', the potential difference occurs between the dummy workpiece W' and each of the first anodes 3a and 3a, because the dummy workpiece W' functions as the first cathode similarly to the workpiece W, and the electric discharge occurs. Then, oxygen gas is converted into a plasma state due to the above described electric discharge, and an oxygen plasma is generated.

At this time, the density of the above described oxygen plasma becomes extremely high in the inside of each of the dummy workpiece W', the first sealing member 2a and the second sealing member 2b, due to the hollow cathode effect. Accordingly, in STEP 11, the above described DLC coating film which has been formed on the inner surface of the first sealing member 2a and the second sealing member 2b can be decomposed and removed by the above described oxygen plasma, and the carbon coating film can be cleaned.

Subsequently, the control device 25 closes the on-off valve 14 which is provided in the duct 9, the primary side valve 17 of the flow rate control device, and the secondary side valve 19 of the flow rate control device, which are provided in the duct 15, and the primary side valve 22 of the flow rate control device, and the secondary side valve 24 of the flow rate control device, which are provided in the duct 20; stops the vacuum pump 26 and the DC pulsed power source 27; and ends cleaning of the above described carbon coating film.

Figure 3:
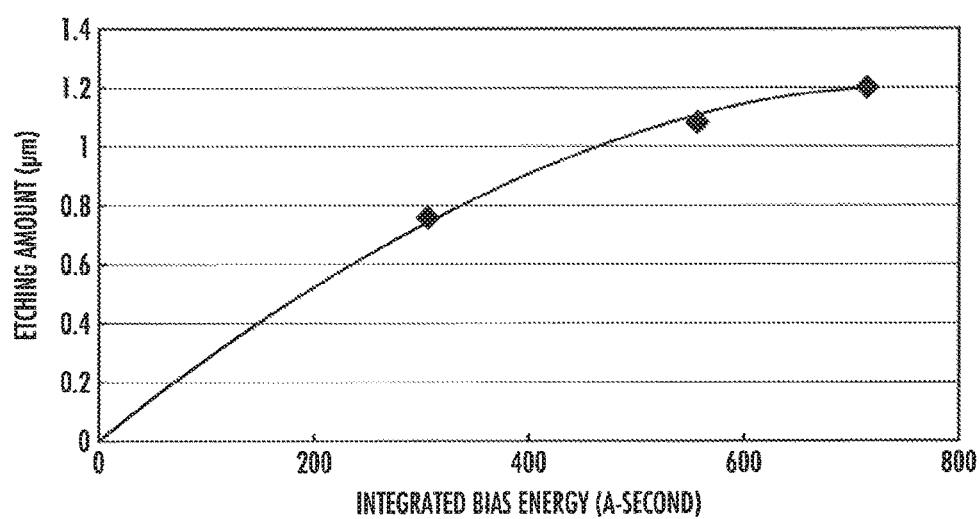
FIG. 3 is a graph showing a relationship between charged bias energy and the amount of an etched DLC coating film in the carbon-coating-film cleaning method of the present invention.

Next, a relationship between bias energy to be applied to the dummy workpiece W' and the amount of the etching of the DLC coating film is shown in FIG. 3. In addition, the above described bias energy is calculated by current value (A)×DC rate (%)×time period (second), and is shown as integrated bias energy (A-second).

It is clear from FIG. 3 that in the carbon-coating-film cleaning device 1, oxygen gas is converted into a plasma state by the integrated bias energy in a range of 300 to 700 A-seconds, thereby the above described DLC coating film can be etched, and the DLC coating film can be decomposed and removed.

Next, a plasma CVD device 41 of the second aspect of the present embodiment will be described with reference to FIG. 4. The plasma CVD device 41 has completely the same configuration as that of the carbon-coating-film cleaning device 1, except that the plasma CVD device 41 has a second anode 3b provided in a more upstream side of the oxygen gas which is supplied from the oxygen-gas supply container 8, than the first anode 3a that is mounted in the second sealing member 2b, and has a second cathode 42 provided between the first anode 3a and the second anode 3b. For this reason, the same configuration will be designated by the same reference numerals, and the detailed description will be omitted.

The second anode 3b is a rod-like electrode, and is inserted into the inside of the second sealing member 2b from a through hole (not-shown) which is provided in the second sealing member 2b. The second anode 3b is insulated from the workpiece W which works as the first cathode, by the second sealing member 2b which is formed of the insulator.

In addition, the second anode 3b is configured so as to be connected to a not-shown circuit to which the first anode 3a is connected and so that a predetermined voltage is applied to the second anode 3b. Here, the predetermined voltage may be applied to either one of the first anode 3a and the second anode 3b, or may also be applied to both of the first anode 3a and the second anode 3b. In addition, the predetermined voltage may be an electric potential of 0 (ground).

The second cathode 42 is connected to the DC cable 35 through the DC cable 43, and is configured so as to be freely connected/disconnected to/from the DC cable 35 by a switch 44 which is provided on the way.

Next, the method for cleaning the carbon coating film by the plasma CVD device 41 of the present embodiment will be described.

Figure 2:
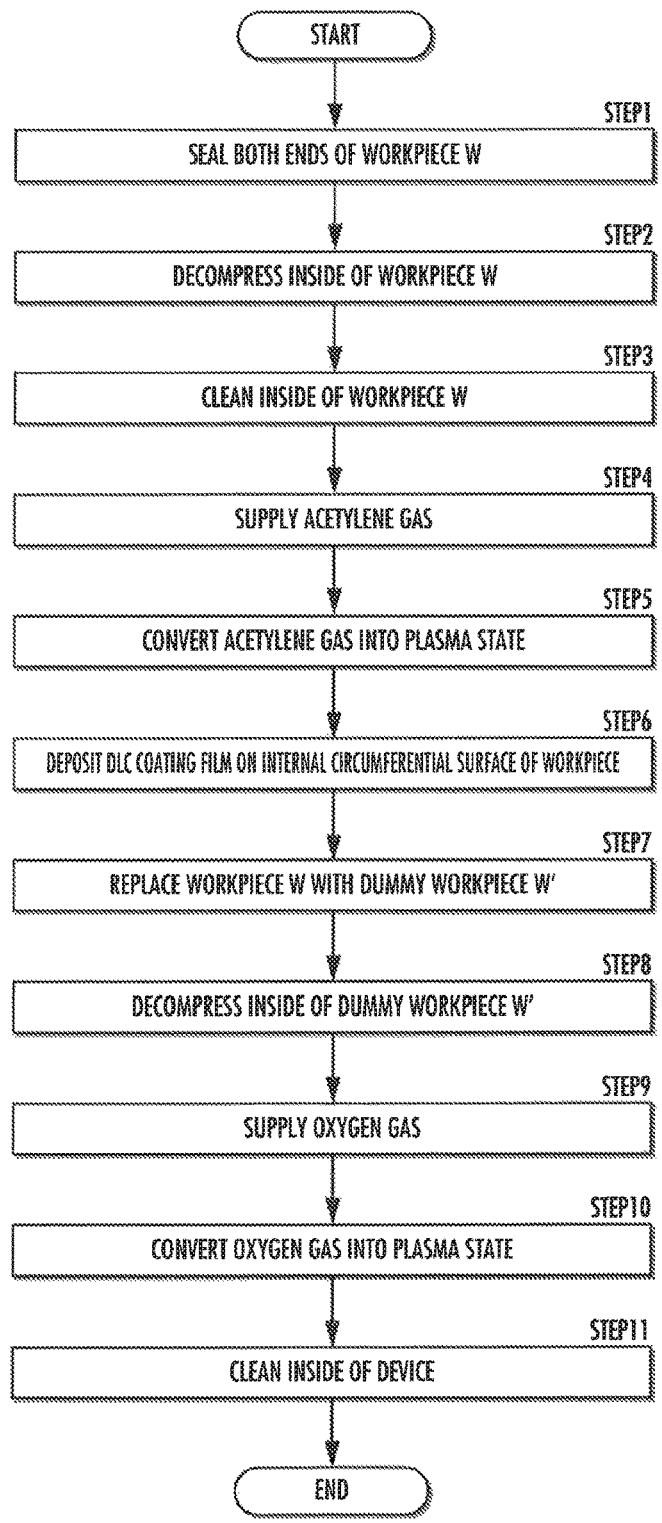
FIG. 2 is a flow chart showing a carbon-coating-film cleaning method of the present invention.

In the plasma CVD device 41, operations of forming the DLC coating film on the inner surface of the workpiece W in STEPs 1 to 6 shown in FIG. 2 can be performed in the completely same method as those in the carbon-coating-film cleaning device 1, in a state in which the second anode 3b is not connected to the above described circuit and the second cathode 42 is disconnected from the DC cable 35.

In the plasma CVD device 41, in STEP 7 shown in FIG. 2, the workpiece W is replaced with the dummy workpiece W', then the second anode 3b is connected to the above described circuit, and the second cathode 42 is connected to the DC cable 35 through the DC cable 43 and the switch 44. Then, operations in STEPs 8 to 11 are performed.

As a result of the above operation, when the oxygen gas which has been supplied to the inside of the dummy workpiece W' is converted into a plasma state in STEP 10, the above described negative pulsed current is supplied to the dummy workpiece W' and the second cathode 42 from the DC pulsed power source 28 through the DC cables 35 and 43, by the control device 25. As a result of the above operation, the bias voltage results in being applied to the dummy workpiece W' and the second cathode 42, potential differences occur between the dummy workpiece W' and each of the first anode 3a and the second anode 3b, and between the second cathode 42 and each of the first anode 3a and the second anode 3b, respectively, and the electric discharges occur. Then, due to the above described electric discharge, oxygen gas is converted into a plasma state, and the oxygen plasma is generated, in between the dummy workpiece W' and each of the first anode 3a and the second anode 3b, and in between the second cathode 42 and each of the first anode 3a and the second anode 3b.

Accordingly, a region in which the above described oxygen plasma is generated is expanded up to a more upstream side of the oxygen gas which is supplied by the oxygen-gas supply container 8, than the first anode 3a that is mounted in the second sealing member 2b, and the above described DLC coating film which has been formed in the periphery of the first anode 3a can be efficiently decomposed and removed.

Figure 4:
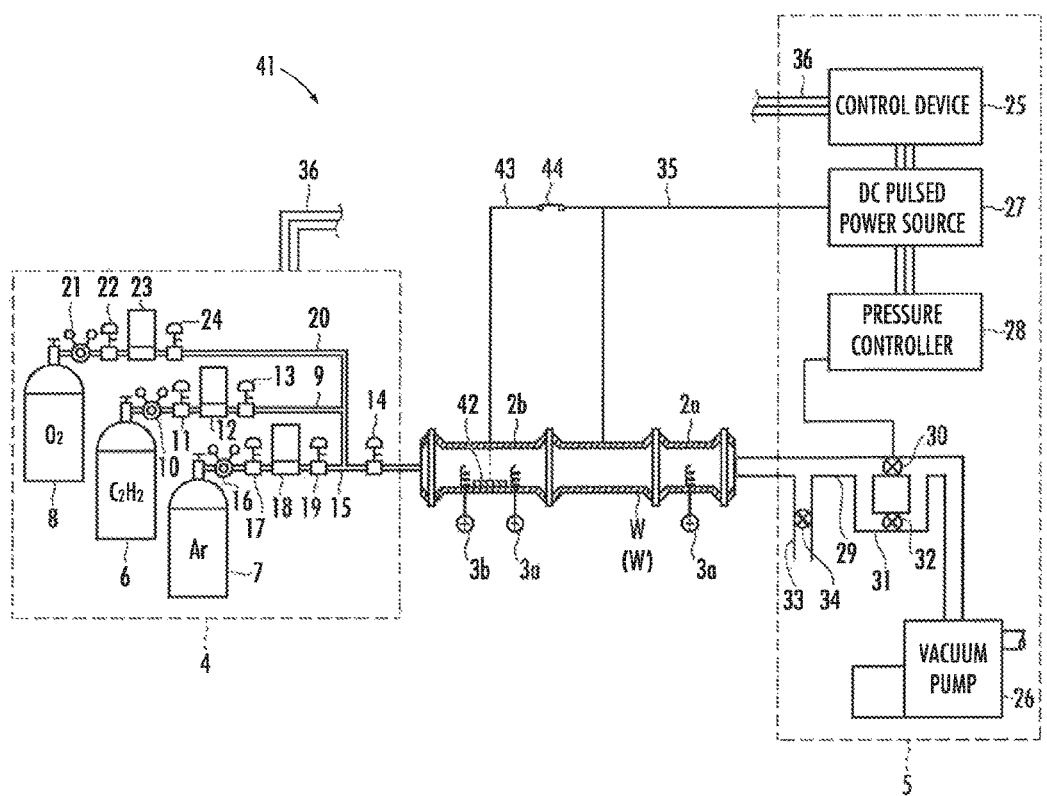
FIG. 4 is a system block diagram showing a configuration of a second aspect of the carbon-coating-film cleaning device of the present invention.

Incidentally, the plasma CVD device 41 shown in FIG. 4 is configured to have both of the second anode 3b and the second cathode 42, but may have either one of the second anode 3b and the second cathode 42.

When the plasma CVD device 41 has only the second anode 3b, in STEP 7 shown in FIG. 2, the workpiece W is replaced with the dummy workpiece W', and then the connection with the above described circuit is switched from the first anode 3a to the second anode 3b. As a result of the above operation, when the oxygen gas which has been supplied to the inside of the dummy workpiece W' is converted into a plasma state in STEP 10, the potential difference occurs between the dummy workpiece W' and the second anode 3b, between which the bias voltage is applied, and the electric discharge occurs. Then, oxygen gas is converted into a plasma state due to the above described electric discharge, and an oxygen plasma is generated between the dummy workpiece W' and the second anode 3b.

Accordingly, a region in which the above described oxygen plasma is generated is expanded up to a more upstream side of the oxygen gas which is supplied by the oxygen-gas supply container 8, than the first anode 3a that is mounted in the second sealing member 2b, and the above described DLC coating film which has been formed in the periphery of the first anode 3a can be efficiently decomposed and removed.

In addition, when the plasma CVD device 41 has only the second cathode 42, in STEP 7 shown in FIG. 2, the workpiece W is replaced with the dummy workpiece W', and then the second cathode 42 is connected to the DC cable 35 through the DC cable 43 and the switch 44. As a result of the above operation, when the oxygen gas which has been supplied to the inside of the dummy workpiece W' is converted into a plasma state in STEP 10, the potential difference occurs between the first anode 3a and each of the second cathode 42 and the dummy workpiece W', between which the bias voltage is applied, and the electric discharge occurs. Then, oxygen gas is converted into a plasma state due to the above described electric discharge, and an oxygen plasma is generated between the first anode 3a and each of the dummy workpiece W' and the second cathode 42.

Accordingly, a region in which the above described oxygen plasma is generated is expanded up to a more upstream side of the oxygen gas which is supplied by the oxygen-gas supply container 8, than the first anode 3a that is mounted in the second sealing member 2b, and the above described DLC coating film which has been formed in the periphery of the first anode 3a can be efficiently decomposed and removed.

REFERENCE SIGNS LIST 1, 41 . . . plasma CVD device, 2a . . . first sealing member, 2b . . . second sealing member, 3a . . . first anode, 3b . . . second anode, 4 . . . gas supply subsystem, 5 . . . process control subsystem, 42 . . . second cathode, W . . . workpiece (first cathode), W' . . . dummy workpiece (first cathode).

What is claimed is:

1. A method for cleaning a carbon coating film in a plasma CVD device which comprises: first and second sealing members each having a hollow bottomed cylindrical shape, and formed of an insulator, such that the first and second sealing members can alternately seal; both opening ends of a cylindrical electroconductive workpiece, respectively, to thereby communicate an inside of the cylindrical electroconductive workpiece with both insides of the first and second sealing members; and, when a cylindrical electroconductive dummy workpiece replaces the cylindrical electroconductive workpiece, both opening ends of the cylindrical electroconductive dummy workpiece, respectively, to thereby communicate an inside of the cylindrical electroconductive dummy workpiece with both insides of the first and second sealing members; a decompression unit which decompresses the inside of the cylindrical electroconductive workpiece through the first sealing member; a power source which applies a bias voltage to the cylindrical electroconductive workpiece or the cylindrical electroconductive dummy workpiece which has both opening ends sealed by the first and second sealing members; a source-gas supply unit which supplies a source gas containing a hydrocarbon to the inside of the cylindrical electroconductive workpiece through the second sealing member; and a first anode which inserts into at least the second sealing member out of the first and second sealing members, and is mounted inside thereof, the method comprising:
providing an oxygen-gas supply unit which supplies oxygen gas, when the cylindrical electroconductive workpiece has been replaced with the cylindrical electroconductive dummy workpiece, to the inside of the cylindrical electroconductive dummy workpiece through the second sealing member, a second cathode to which the bias voltage is applied by the power source, the second cathode being provided inside the second sealing member and upstream from the first cathode along a direction oxygen gas is supplied from the oxygen-gas supply unit, a second anode which inserts into the second sealing member and is mounted inside thereof to be provided upstream from the first anode along the direction oxygen gas is supplied from the oxygen gas supply unit and between the first cathode and the second cathode, and a circuit which selectively applies a predetermined voltage to the first anode and the second anode;
a step of forming the carbon coating film on an inner surface of the cylindrical electroconductive workpiece by sealing both ends of the cylindrical electroconductive workpiece with the first and second sealing members, respectively, applying the bias voltage from the power source to the cylindrical electroconductive workpiece which is set as a first cathode with respect to the first anode or the second anode, and applying the predetermined voltage from the circuit to at least the first anode, while supplying the source gas by the source-gas supply unit to the inside of the cylindrical electroconductive workpiece that has been decompressed to a predetermined degree of vacuum by the decompression unit, and thereby generating a plasma of the source gas in the inside of the cylindrical electroconductive workpiece;
a step of replacing the cylindrical electroconductive workpiece having the carbon coating film formed on the inner surface with the cylindrical electroconductive dummy workpiece, and generating an oxygen plasma in the inside of the cylindrical electroconductive dummy workpiece, by decompressing the inside of the cylindrical electroconductive dummy workpiece to a predetermined degree of vacuum by the decompression unit, applying the bias voltage from the power source to the cylindrical electroconductive dummy workpiece which is set as the first cathode with respect to the first anode or the second anode, while supplying oxygen gas to the inside of the cylindrical electroconductive dummy workpiece by the oxygen-gas supply unit and applying the predetermined voltage to only the second anode, among the first anode and the second anode; and
a step of decomposing and removing the carbon coating film which is formed on each portion of the plasma CVD device, by the oxygen plasma.

2. The method for cleaning the carbon coating film according to claim 1, wherein a workpiece to be treated next is used as the dummy workpiece.

3. A plasma CVD device comprising:
first and second sealing members each having a hollow bottomed cylindrical shape and formed of an insulator, such that the first and second sealing members can alternately seal: both opening ends of a cylindrical electroconductive workpiece, respectively, to thereby communicate an inside of the cylindrical electroconductive workpiece with both insides of the first and second sealing members; and, when a cylindrical electroconductive dummy workpiece replaces the cylindrical electroconductive workpiece, both opening ends of the cylindrical electroconductive dummy workpiece, respectively, to thereby communicate an inside of the cylindrical electroconductive dummy workpiece with both insides of the first and second sealing members;
a decompression unit which decompresses the inside of the cylindrical electroconductive workpiece through the first sealing member;
a source-gas supply unit which supplies a source gas containing a hydrocarbon to the inside of the cylindrical electroconductive workpiece through the second sealing member;

a first anode which inserts into at least the second sealing member out of the first and second sealing members, and is mounted inside thereof;

an oxygen-gas supply unit which supplies oxygen gas to an inside of the cylindrical electroconductive dummy workpiece through the second sealing member when the cylindrical electroconductive workpiece has been replaced with the cylindrical electroconductive dummy workpiece;

a second anode which inserts into the second sealing member and is mounted inside thereof to be provided upstream from the first anode along a direction oxygen gas is supplied from the oxygen gas supply unit;

a power source which applies a bias voltage to the cylindrical electroconductive workpiece or the cylindrical electroconductive dummy workpiece which has both opening ends sealed by the first and second sealing members and is set as a first cathode with respect to the first anode or the second anode; and a circuit which applies a predetermined voltage to at least the first anode when the source gas is supplied from the source-gas supply unit to the inside of the cylindrical electroconductive workpiece, and which applies the predetermined voltage to only the second anode, among the first anode and the second anode, when oxygen gas is supplied by the oxygen-gas supply unit to the inside of the cylindrical electroconductive dummy workpiece; and a second cathode to which the bias voltage is applied by the power source, the second cathode being provided inside the second sealing member and upstream from the first cathode along the direction oxygen gas is supplied from the oxygen-gas supply unit, wherein the second anode is provided in the second sealing member and between the first cathode and the second cathode.

4. The device according to claim 3, wherein the first sealing member is provided between the decompression unit and the cylindrical electroconductive workpiece or the cylindrical electroconductive dummy workpiece, and the second sealing member is provided between the source-gas supply unit and the cylindrical electroconductive workpiece or the cylindrical electroconductive dummy workpiece, and between the oxygen-gas supply unit and the cylindrical electroconductive workpiece or the cylindrical electroconductive dummy workpiece.

* * * * *